United States Patent [19]
Alleven

[11] Patent Number: 5,912,569
[45] Date of Patent: Jun. 15, 1999

[54] METHODS, CIRCUITS AND DEVICES FOR IMPROVING CROSSOVER PERFORMANCE AND/OR MONOTONICITY, AND APPLICATIONS OF THE SAME IN A UNIVERSAL SERIAL BUS (USB) LOW SPEED OUTPUT DRIVER

[75] Inventor: Gary W. Alleven, Eden Prairie, Minn.

[73] Assignee: Cypress Semiconductor Corp., San Jose, Calif.

[21] Appl. No.: 08/934,933

[22] Filed: Sep. 22, 1997

[51] Int. Cl.⁶ .............................................. H03K 19/0185
[52] U.S. Cl. .......................... 327/108; 327/112; 327/379; 326/27; 326/83
[58] Field of Search ..................... 327/108, 112, 327/378, 379, 384, 389, 391; 326/26, 27, 82, 83, 87, 90, 91

[56] References Cited

U.S. PATENT DOCUMENTS

| | | | |
|---|---|---|---|
| 4,820,944 | 4/1989 | Herlein et al. | 327/270 |
| 5,389,828 | 2/1995 | Tago | 327/276 |
| 5,675,813 | 10/1997 | Holmdahl | 395/750 |

FOREIGN PATENT DOCUMENTS

| | | | |
|---|---|---|---|
| 2-288724 | 11/1990 | Japan | 327/269 |
| 9736230 | 10/1997 | WIPO . | |

OTHER PUBLICATIONS

Design Guide for a Low Speed Buffer for the Universal Serial Bus Revision 1.1, Dec., 1996 Intel Corporation, pp. 1–29.

Universal Serial Bus Specification, Chapter 7—Electrical, Jan. 15, 1996, pp. 111–143.

*Primary Examiner*—Timothy P. Callahan
*Assistant Examiner*—Tuan T. Lam
*Attorney, Agent, or Firm*—Christopher P. Maiorana; Maiorana & Acosta, P.C.

[57] ABSTRACT

A circuit comprising a first driver circuit, a second driver circuit and a delay circuit. The first driver circuit may be configured to generate a first output signal and a control signal in response to a first input signal. The delay circuit may be configured to generate a delay signal in response to a second input signal and the control signal. The second driver circuit may be configured to generate a second output signal in response to the delay signal.

16 Claims, 7 Drawing Sheets

METHODS, CIRCUITS AND DEVICES FOR IMPROVING CROSSOVER PERFORMANCE AND/OR MONOTONICITY, AND APPLICATIONS OF THE SAME IN A UNIVERSAL SERIAL BUS (USB) LOW SPEED OUTPUT DRIVER

FIELD OF THE INVENTION

The present invention relates to low speed drivers generally and, more particularly, to a low speed driver for use with the universal serial bus that provides improved crossover performance and/or monotonicity.

BACKGROUND OF THE INVENTION

The universal serial bus (USB) has a variety of operating modes that allow a number of computer peripherals to be connected to a generic port. One of the modes of a USB device is a low speed mode. While operating in the low speed mode, the outputs of a USB device are generally very slow transitioning signals. One design criteria involved with USB devices is that there may be a large variation in the load placed on the device. As a result, the USB device must be designed to provide the proper speed at the output across wide load variations.

The USB specification calls for controlled differential rise and fall times over a 7:1 range of load capacitances (i.e., from 50 pf to 350 pf) for operation in the low speed mode. The USB specification also requires that the differential outputs cross between 1.3 and 2.0 volts over the entire load range. A particular design problem in implementing an output driver to meet the crossover specification occurs since the negative output signal generally contains a 1.5 KΩ pull-up resistor at the output. The pull-up resistor causes the negative output to rise more quickly than the positive output causing an imbalance in the output crossovers. The crossovers are also effected by process and temperature variations. As a result, the circuit must not only change the signal delay, but must also track the process and temperature variations.

Referring to FIG. 1, a conventional USB driver circuit 10 is shown which implements operational amplifiers 12,14 to control the transitioning of the output signal. The circuit 10 generally requires the use of the operational amplifier 12 and the operational amplifier 14 to control the signal presented at an output pad 16. The circuit 10 also requires a variety of transistors, a bias circuit 18, a predriver circuit 20 and a clamp circuit 22. More information regarding the circuit of FIG. 1 may be found in the paper "Design Guide For A Low Speed Buffer For The Universal Serial Bus," published in December 1996, the appropriate sections which are hereby incorporated by reference.

Each universal serial bus device has two outputs, a plus output and a minus output. The circuit 10 would have to be implemented, at a minimum, at each of the plus and minus outputs of each device. In an application that provides a number of universal serial bus outputs on a single device, the number of instances that the circuit 10 would have to be duplicated increases accordingly. As a result, it is desirable for the number of components in the circuit 10 be kept to a minimum in order to reduce the overall area required to implement the plurality of required buffers at the various outputs.

The USB specification also requires that the differential outputs be monotonistic (i.e., smoothly transitioning). When switching from a HIGH (e.g., "1") to a LOW (e.g., "0") in low speed mode, the pull-up resistor on the D– output signal generally causes the D– output to pull toward the power supply voltage until the NMOS pull-down transistor reaches its threshold voltage. This may cause a variation in voltage, or a "bump," to occur on the output. It is generally desirable to reduce the bump at the output.

SUMMARY OF THE INVENTION

The present invention concerns a circuit comprising a first driver circuit, a second driver circuit and a delay circuit. The first driver circuit may be configured to generate a first output signal and a control signal in response to a first input signal. The delay circuit may be configured to generate a delay signal in response to a second input signal and the control signal. The second driver circuit may be configured to generate a second output signal in response to the delay signal.

An alternate embodiment of the present invention concerns a threshold-dependent gated current source configured to compensate for the delay associated with an input buffer. A comparator may be used to detect when one of the outputs has reached a threshold voltage. A signal may then be sent to a transistor or other switching device to disable a current source compensation circuit. When the differential output buffer begins its transition for the D– output, the D+ output will begin to transition to a HIGH state. Next, the D– output will begin to transition to a LOW state. The pull-up transistor on the D– output generally shuts off at the start of the cycle. The current source is generally disabled when the transistor reaches its turn on threshold voltage.

The objects, features and advantages of the present invention include providing a gated current source that reduces output buffer delay, reduces spikes in the output voltage and reduces the overall chip area needed to implement the invention.

Other objects, features and advantages of the present invention include providing a circuit that closely matches the threshold voltage changes in a USB device due to process variations, provides rapid state changes, provides a delay that may be a function of load, and provides a delay as a function of process changes.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
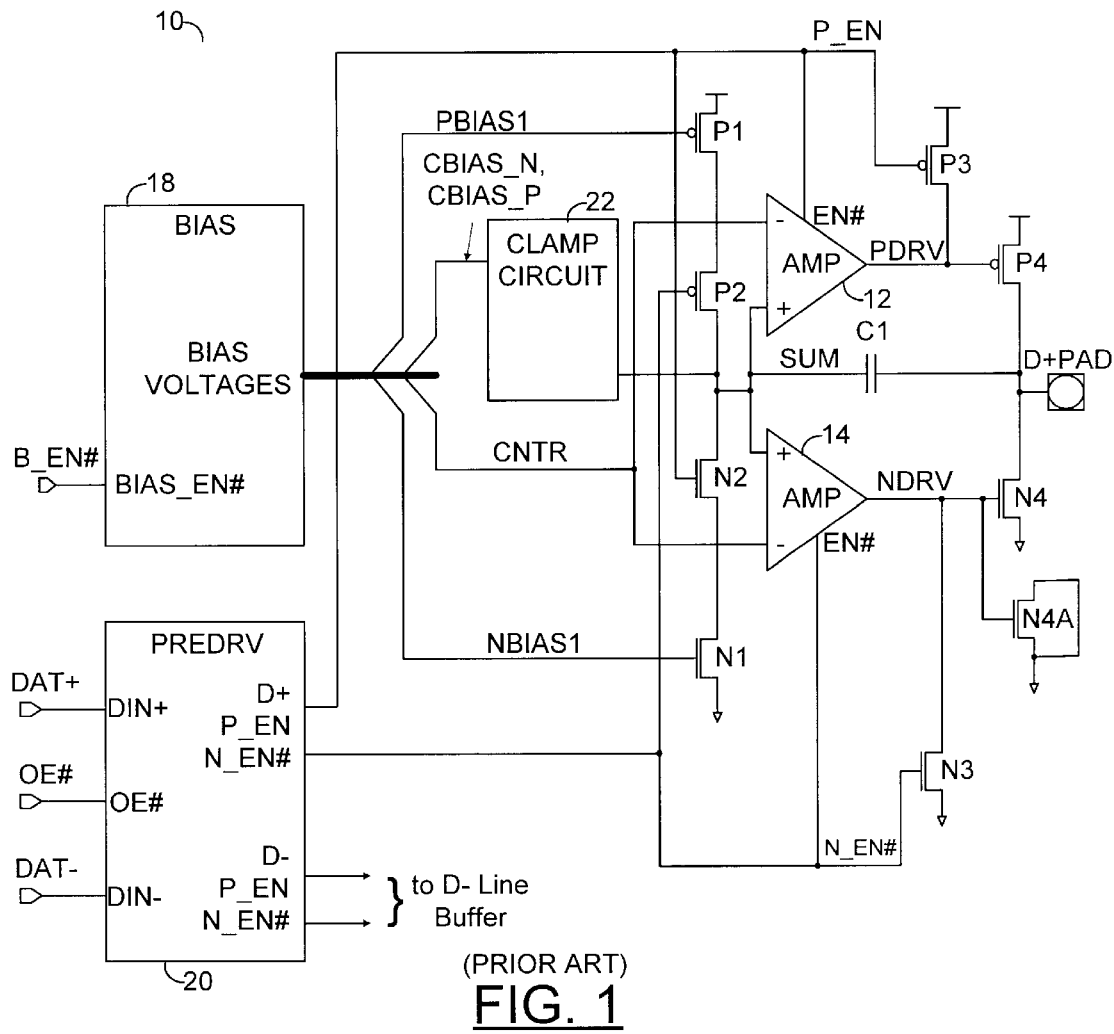
FIG. 1 is a block diagram of a conventional buffer for use in a low speed application USB.
Figure 2:
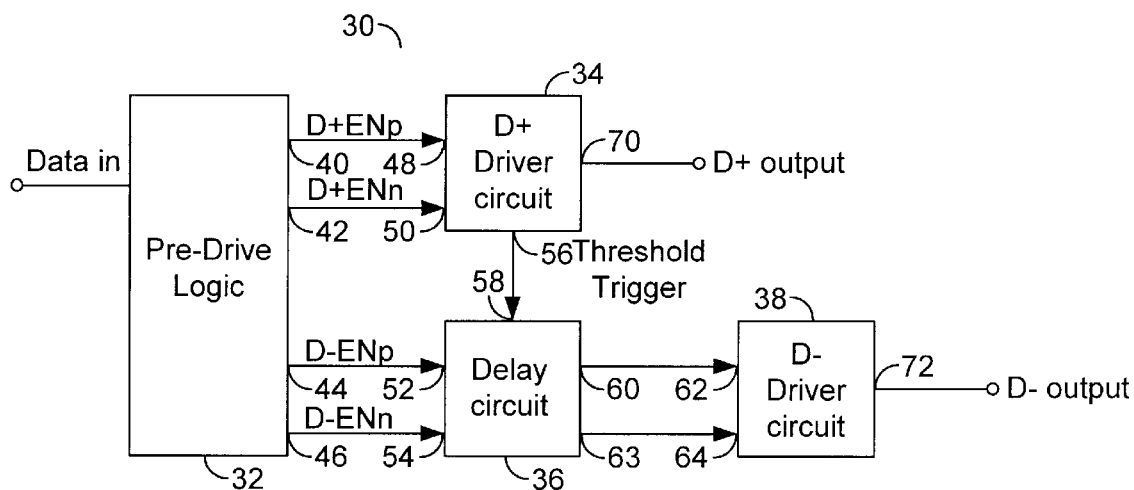
FIG. 2 is a block diagram of a preferred embodiment of the present invention.

Referring to FIG. 2, a block diagram of a circuit 30 is shown in accordance with a preferred embodiment of the present invention. The circuit 30 generally comprises a pre-drive logic block (or circuit) 32, a D+ driver block (or circuit) 34, a delay block (or circuit) 36 and a D− driver block (or circuit) 38. The pre-drive logic block 32 may have an output 40 that may present a first output signal (e.g., D+ ENp), an output 42 that may present a second signal (e.g., D+ ENn), an output 44 that may present a third signal (e.g., D− ENp) and an output 46 that may present a fourth signal (e.g., D− ENn). The first and second output signals as well as the third and fourth output signals are generally complementary signals. The D+ driver circuit 34 generally has an input 48 that may receive the first signal presented at the output 40 and an input 50 that may receive the second signal presented at the output 42. The delay circuit 36 generally comprises an input 52 that may receive the third signal presented at the output 44 and an input 54 that generally receives the fourth signal presented at the output 46. The circuit 34 also comprises an output 56 that may present a control signal (e.g., Threshold Trigger) to an input 58 of the delay circuit 36.

The delay circuit 36 generally comprises an output 60 that may present a signal to an input 62 of the D− driver circuit 38 and an output 63 that may present a signal to the input 64 of the D− driver circuit 38. The driver circuit 34 generally has an output 70 that may present the D+ output while the driver circuit 38 has an output 72 that may present the D− output.

Figure 3:
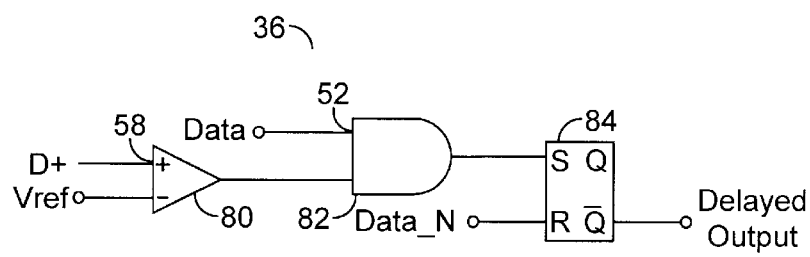
FIG. 3 is a circuit diagram of the delay element of FIG. 2.

Referring to FIG. 3, a diagram of a portion of the delay circuit 36 is shown. The delay circuit 36 generally comprises a comparator 80, an enable logic 82 (shown generally as an AND gate) and a flip-flop 84. The comparator 80 may receive the signal from the input 58 of FIG. 2, the enable logic 82 may receive the signal from the input 52 of FIG. 2 and the flip-flop 84 may receive the signal from the input 54 of FIG. 2.

When the data signal received at the inputs 52 and 54 transitions (i.e., from a "1" to a "0" or from a "0" to a "1" depending on the polarity convention implemented), the logic block 82 becomes enabled. After the logic block 82 is enabled, the state of the flip-flop 84 generally waits to change states until the voltage from the D+ gate control exceeds the reference voltage, at which point the flip-flop 84 generally changes states. The output of the flip-flop 84 may then enable the slew rate control circuitry (not shown). When the data signal changes states again, the S input to the flip-flop 84 will become a "0" and the R input will become a "1", generally causing the flip-flop 84 to be reset. As a result, the signals that control the flip-flop 84 will not be "1" at the same time.

The transition of the data signal generally allows a flip-flip 84 (e.g., a RS or set/reset flip-flop) to provide the appropriate delay as opposed to implementing a sophisticated clocking scheme. However, other flip-flops may be substituted accordingly to meet the design criteria of a particular application.

The flip-flop 84 described in connection with FIG. 3 may generally hold data received at the input until the comparator output reaches a "1". In the most generic form, the enable logic 84 may be implemented as an AND gate. The circuit 84 waits until a particular condition occurs at the S input and provides an output adding a delay equal to, in one example, the time it takes for D+ driver circuit to turn on. The advantages of implementing the circuit 84 as a flip-flop are important to devices having limited chip area available. Since a flip-flop may be implemented in as few a two gates, the overall circuit area required may be reduced. Additionally, the requirement of having a clocked device may be eliminated with such a configuration.

Figure 4:
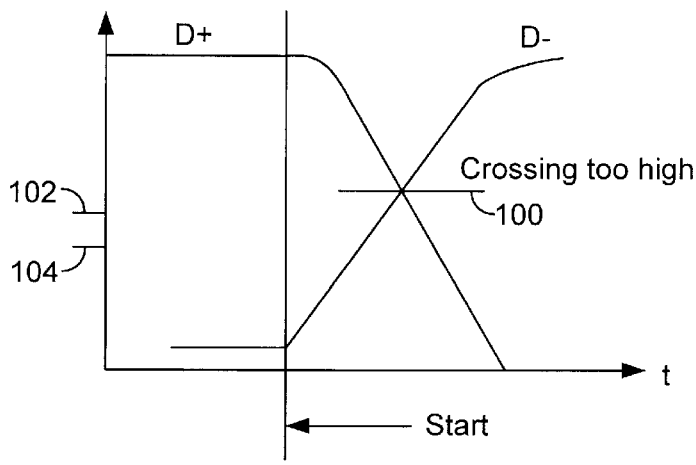
FIG. 4 is a plot of the outputs of the conventional buffer of FIG. 1.
Figure 5:
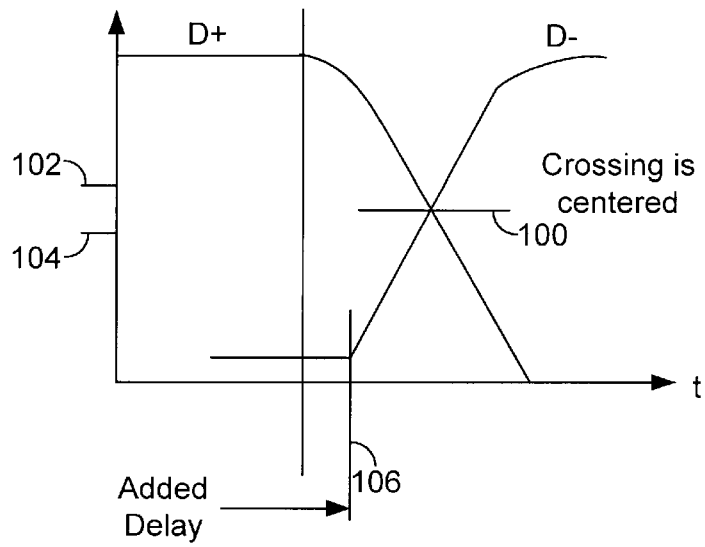
FIG. 5 is a plot of the outputs of the device of the preferred embodiment of the present invention showing a proper crossover.

FIGS. 4 and 5 illustrate the differences in the output of the circuit 30 with the addition of the delay circuit 36. FIG. 4 illustrates the output of circuit 30 without the delay circuit 36. Specifically, the output D+ is shown transitioning from a high state to a low state while the output D− is shown transitioning from a low state to a high state. The crossing point, illustrated by the horizontal line 100, is too high in this example. In particular, if the specification (e.g., the USB specification) calls for the crossing point to be between voltages defined by the horizontal mark 102 and the horizontal mark 104 (generally measured in volts), the horizontal line 100 is generally out of the specification tolerance.

FIG. 5 illustrates a delay compensated D− output. The delay provided by the delay circuit 36 is shown on the time axis (e.g., t) to delay the additional rise time of the D− output until a time illustrated by the vertical line 106. Since the delay is introduced only to the D− output, the crossing point, illustrated by the horizontal line 100, is shown to be within the specification defined by the horizontal marks 102 and 104. The particular amount of delay presented by the delay circuit 36 may be adjusted accordingly to meet the design criteria of a particular application. In particular, if the tolerance between the marks 102 and 104 is extremely sensitive, the particular amount of delay added by the delay circuit 36 may be adjusted to provide the appropriate crossing between the D+ and D− outputs.

Since the delay output from the circuit 84 is controlled by the comparator circuit 80, as well as the enable logic 82, the delay function will compensate for process changes. As a result, the circuit 36 will be stable over a variety of process, temperature and voltage variations.

Figure 6:
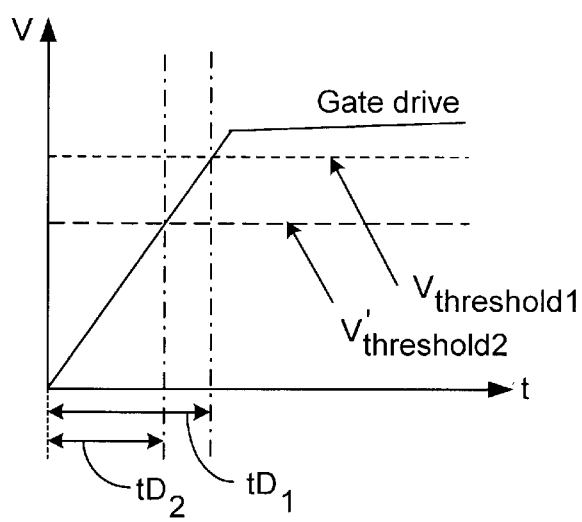
FIG. 6 is a plot of the gate drive showing the threshold voltage.

FIG. 6 illustrates the gate drive of the comparator circuit 80 verses the threshold voltage. The comparator 80 may present a control signal in response to the threshold trigger signal (e.g., the D+ pull down signal from the circuit 34) at one input and a reference voltage (e.g., Vref) at the other input. The reference voltage in FIG. 3 is generally configured to be a threshold voltage. By varying the threshold voltage, the particular amount of delay introduced by the delay circuit 36 may be adjusted. Specifically, a higher threshold voltage may be used to introduce a longer delay. For example, if the voltage reference Vref is set at the voltage threshold (e.g., Vthreshold1), the delay presented from the delay circuit 36 generally corresponds to a first time delay (e.g., tD1), illustrated in the time axis t of the diagram. If the voltage reference signal Vref is decreased to equal the threshold voltage Vthreshold2, the delay presented from delay circuit 36 may be equal to a time delay (e.g., tD2).

Figure 7:
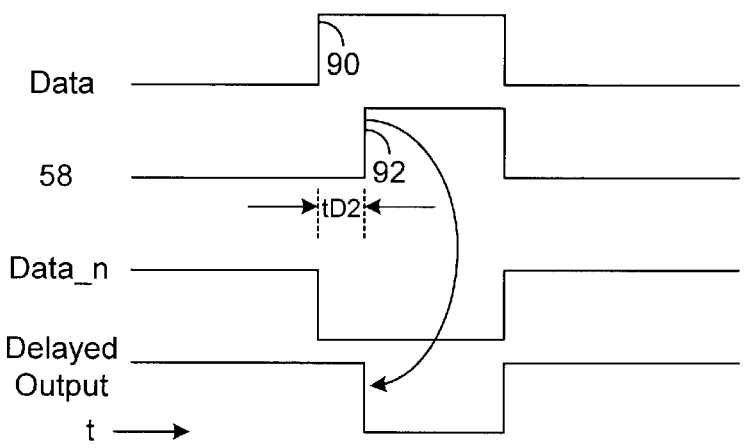
FIG. 7 is a timing diagram illustrating the various waveforms of the circuit of FIG. 3.

Referring to FIG. 7, a timing diagram of the various waveforms. is shown. The signal Data is shown having a positive transition 90, while the signal 58 is shown having a positive transition 92. The time difference between the positive transitions 90 and 92 is generally equal to the time delay tD2. The signal data__n signal is generally inverted from the signal Data. Similarly, the delayed output signal is generally inverted from the signal 58.

Figure 8:
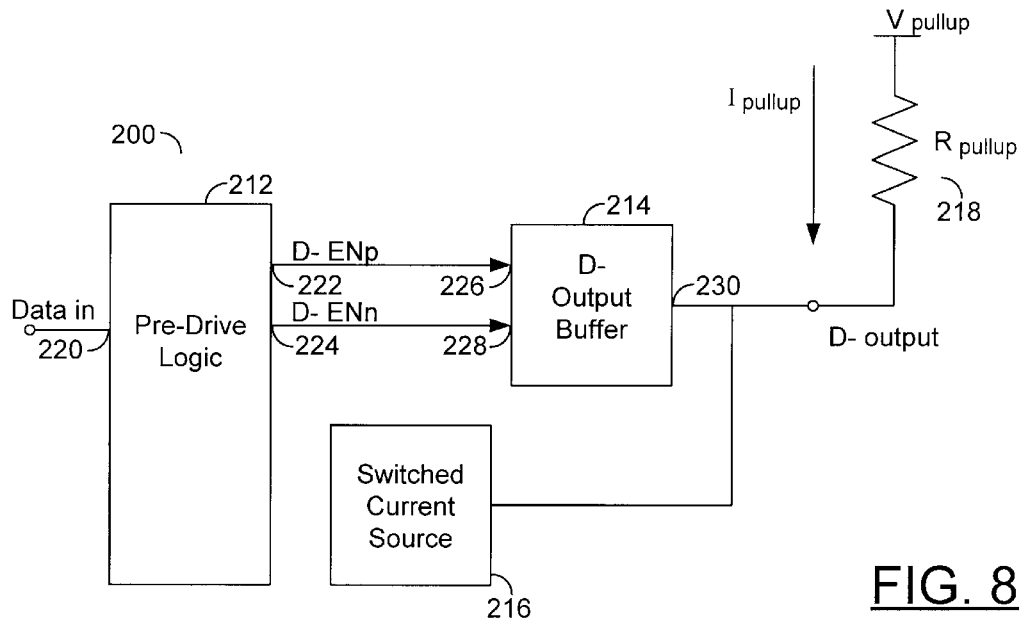
FIG. 8 is a block diagram of an alternate embodiment of the present invention.

Referring to FIG. 8, a block diagram of a circuit 200 is shown in accordance with an alternate embodiment of the present invention. The circuit 200 generally comprises a pre-drive logic block (or circuit) 212, a D− output buffer 214, a switched current source block (or circuit) 216 and an output resistor 218. The pre-drive logic block 212 comprises an input 220 for receiving an input signal (e.g., DATAIN), an output 222 for presenting a first output signal (e.g., D−ENp) and an output 224 for presenting a second output signal (e.g., D−ENn). The signal at the output 222 may be presented to an input 226 of the buffer 214. The signal at the output 224 may be presented to an input 228 of the buffer 214. The buffer 214 has an output 230 that presents an output signal (e.g., D− output). The signal OUTPUT may be presented to the resistor 218. The switched current source 216 may also be coupled to the output 230 to control the signal presented to the resistor 218. The switched current source 216 may act to compensate for the effects of the pull-up resistor 218, which may be present at the D− output of a typical USB driver.

Figure 9:
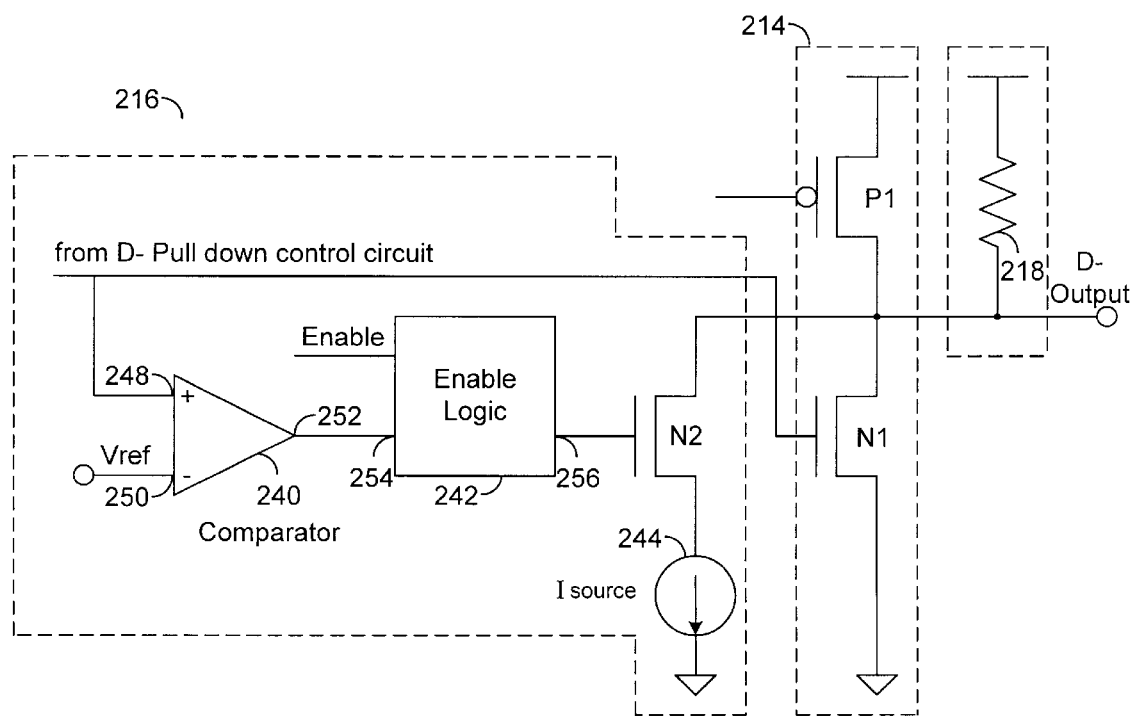
FIG. 9 is a block diagram of the switched current source shown in FIG. 8.

Referring to FIG. 9, a more detailed block diagram of the switched current source 216 is shown. The switched current source 216 generally comprises a comparator 240, an enable logic block (or circuit) 242, and a current source 244. The D− output buffer 214 generally comprises a transistor N1 and a transistor P1. An input 248 of the comparator 240 may receive a signal from the D− output buffer 230. The gate of the transistor N1 may also receive the signal from the D− output buffer 230. A voltage reference (e.g., Vref) may be presented to an input 250 of the comparator 240. An output 252 of the comparator 240 may be presented to an input 254 of the enable logic 242. The enable logic 242 has an output 256 that may present a control signal to the gate of the transistor N2. The current source 244 may be coupled between the transistor N2 and ground. The current source 244 may provide a constant current that may be turned "on" and "off" in response to the enable logic 242. The source of the transistor N1, the source of the transistor N2, the drain of the transistor P1 and a first side of the resistor 218 may be coupled together to provide the D− output. The gate of the transistor P1 is generally controlled by control circuity (not shown) associated with a positive transition of the output.

The control signal presented at the output 252 along with the enable logic 242 generally controls the operation of the transistor N2. As a result, the control signal presented at the output 256 may control when the current source 244 will be "on" or "off". The comparator 240 generally determines when the voltage on the gate of the transistor N1 is at or above a threshold voltage (e.g., Vth as described in connection with FIG. 6). When the threshold voltage Vth exceeds the reference voltage Vref, the current source 244 will generally be enabled by the enable logic 242. Until the threshold voltage Vth exceeds the reference voltage Vth, the current source 244 may continue to compensate for the effect of the pull-up resistor 218. After the pull-down device N1 starts to conduct, the output 252 of the comparator will have changed and the current source 244 will generally be turned "off". The D− output may then operate as a function of only the transistor N1 (and the transistor P1).

Figure 10:
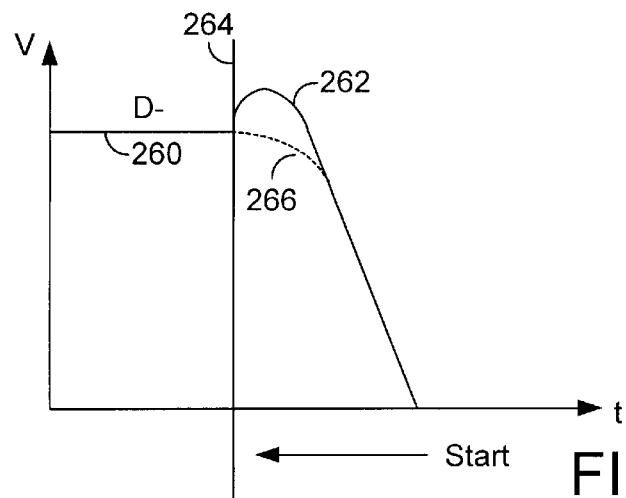
FIG. 10 is a graphical representation of the output of the circuit of FIG. 1 without the switched current source.

Referring to FIG. 10, a waveform illustrating the response of the D− output before and after compensation is shown. A trace 260 is shown having a bump 262 occurring after the crossing of a vertical line 264. The vertical line 264 generally indicates a time when the circuit 200 transitions between a logic high and a logic low signal. The bump 262 results from the presence of the resistor 218. After the bump 262, the trace 260 generally exhibits a linear transition. As a result, the compensation of the bump 262 may only be necessary for a short time after the transition begins at the vertical line 264. The dotted trace 266 illustrates the transition of the D− output when incorporating the switched current source 216. Without the compensation of the switched current source 216, the bump 262 may produce Electromagnetic Interference (EMI).

Figure 11:
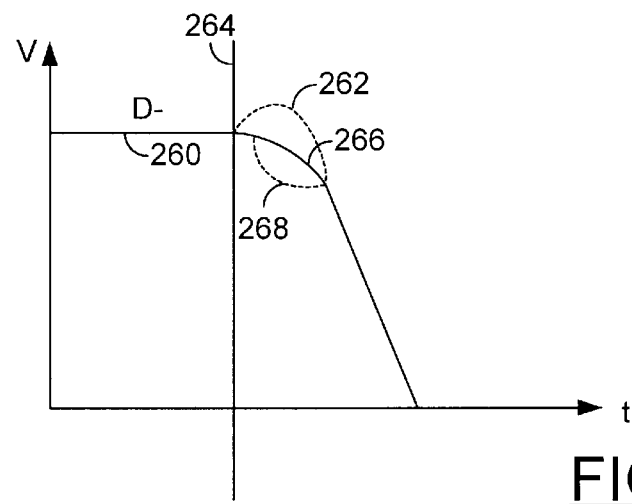
FIG. 11 is a graphical representation of the output of the circuit of FIG. 1 with the switched current source.

Referring to FIG. 11, a waveform illustrating additional characteristics of the circuit 200 is shown. The waveform 266 is now shown as a solid line during the duration when the switched current source 216 provides compensation. The bump 262 is shown generally as a dotted trace. A new dotted trace 268 is shown for a time similar to the duration of the bump 262. The dotted trace 268 illustrates an effect that may occur if the switched current source 216 provides a current source that is too strong (i.e., provides too much compensation). As a result, the amount of current provided by the current source 244 may be adjusted accordingly to meet the design criteria of our particular application. In general, the amount of current provided by the current source 244 should be enough to avoid the bump 262, but not too much so as to over dampen the bump 262 and introduce additional discontinuities such as the dotted trace 268. In one example, the current source 244 may provide between 50 and 300 mA of additional current, or preferably between 100 and 250 mA of current, and most preferably approximately 150 mA of current.

Figure 12:
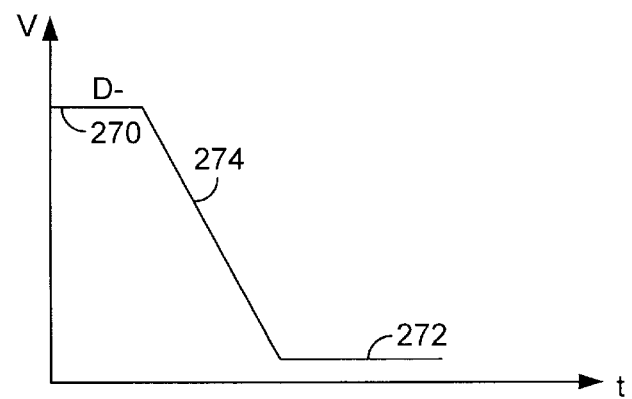
FIG. 12 is a graph illustrating an ideal high to low transition.

Referring to FIG. 12, an ideal transition between a logic high and a logic low at the D− output is shown. The logic high portion is generally shown by the trace 270, the logic low is generally shown by the trace 272 and the transition period is generally shown by the trace 274. The change between the trace 270 and 274 is generally an abrupt change, not exhibiting either the bump 262 or the discontinuity illustrated by the trace 268. While this may be the ideal situation, the gradual curve illustrated in FIG. 11 provides acceptable results that may be properly used by additional devices connected to the D− output.

Figure 13:
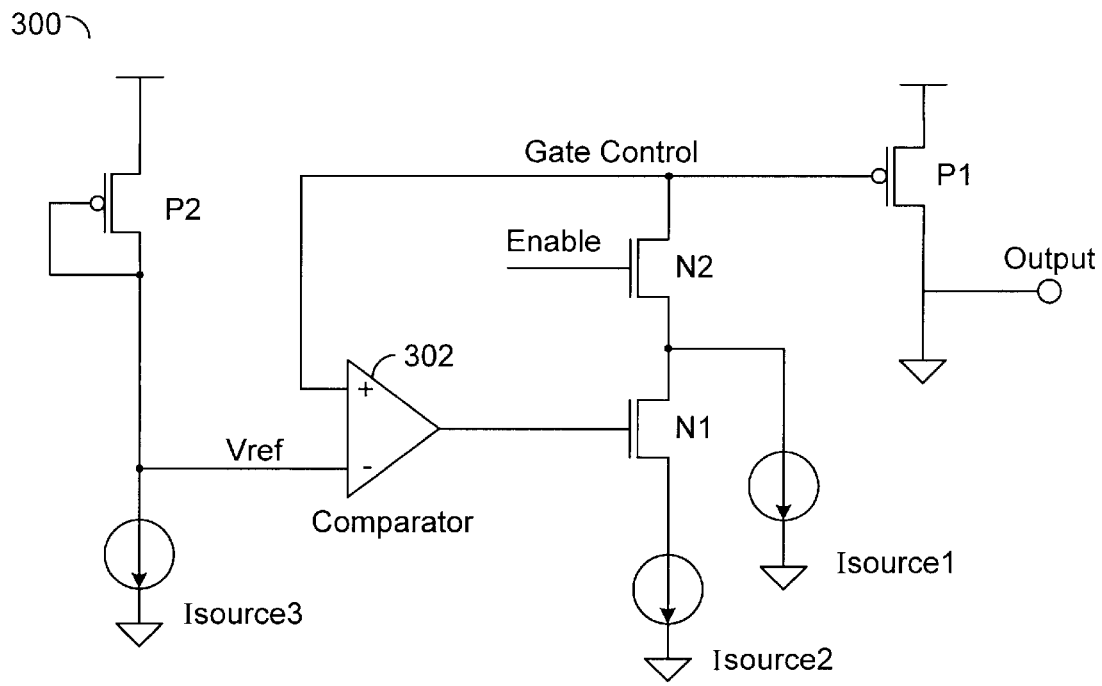
FIG. 13 illustrates a circuit diagram of a second alternate embodiment of the present invention.

Referring to FIG. 13, a circuit 300 is shown in accordance with a second alternate embodiment of the present invention. The circuit 300 generally comprises a transistor Pi, a current source Isource1, a current source Isource2, a current source Isource3, a comparator 302, a transistor N1, a transistor N2 and a transistor P2. The transistors P1 and P2 each have sources connected to a supply voltage. The drain of the transistor P1 is generally coupled to ground. The drain of the transistor P2 may be coupled to a first side of the current source Isource3 as well as to a negative input of the comparator 302. The gate and drain of the transistor P2 are generally coupled together. The current source Isource3 is generally coupled between the negative input of the comparator 302 and ground. The gate of the transistor P1 is generally coupled to the source transistor N1 as well as to the positive input of the comparator 302. The output of the comparator 302 is generally coupled to the gate of the transistor N1. The drain of the transistor N1 is generally coupled to ground through the current source Isource2. Similarly, the drain of the transistor N2 is generally coupled to ground through the current source Isource1. The drain of the transistor N2 is also generally coupled to the source of the transistor N1.

Figure 14:
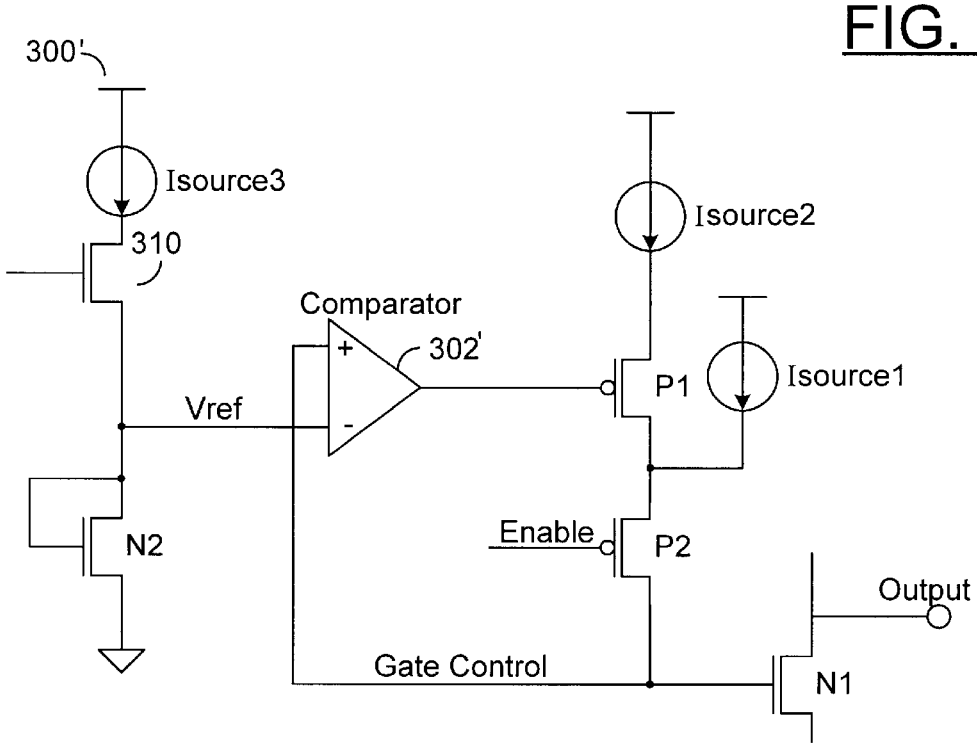
FIG. 14 illustrates a circuit diagram of an alternate implementation of the second alternate embodiment of the present invention.

Referring to FIG. 14, an alternate implementation of the circuit 300 is shown illustrated as the circuit 300'. The circuit 300' generally comprises a current source Isource1, a current source Isource2, a current source Isource3, a transistor 310, a transistor N1, a transistor N2, a transistor P1, a transistor P2 and a comparator 302'. The current source Isource3 is generally coupled between a supply voltage and a source of the transistor 310. The drain of the transistor 310 is generally coupled to the source and gate of the transistor N2 as well as to a negative input of the comparator 302'. The drain of the transistor N2 is generally coupled to ground. A positive input of the comparator 302' is generally coupled to the drain of the transistor P2 as well as to the gate of the transistor N1. Comparator 302' is generally coupled to the gate transistor P1. The source of the transistor P1 is generally coupled to a supply voltage through the current source ISource2. The drain of the transistor P1 is generally coupled to the source of the transistor P2 as well as to the supply voltage through the current source Isource1.

The comparator 302 generally drives the gate of the transistor N1 with an output signal. The first current source Isource1 may be used as part of a slew rate control circuit. The current source Isource2 is generally used to quickly drive the gate voltage to a threshold value. The current source Isource1 and the current source Isource2 may be combined as a control circuit to present the gate control voltage. Once the gate control voltage has reached the threshold voltage Vth, the comparator 302 disables the current source Isource2 which may prevent the disruption of the slew rate control function.

The current source Isource3 generally establishes the reference voltage Vref presented to the negative input of the comparator 302'. The reference voltage Vref generally tracks the threshold voltage Vth at the gate of the transistor N1 in an effort to pull the gate voltage up to, but not exceeding, the threshold voltage Vth. The match generally occurs when the current source Isource3 is small and the size of the transistor N2 is large. The reference voltage may be defined by the following EQUATION 1:

$$Vref = V_T + (2IdL/K'nW)^{1/2}$$

The various variables may be defined generally as:
Id=Drain Current
L=Channel Length in microns
W=Channel width in microns
K'n=Process constant The reference voltage Vref may closely approximate the threshold voltage Vt when the drain current Id is small (e.g., less than 20 $\mu$A) and the channel width W is large (e.g., more than 50 microns). However, the drain current Id and the channel width W may be adjusted accordingly to meet the design criteria of a particular application.

Figure 15:
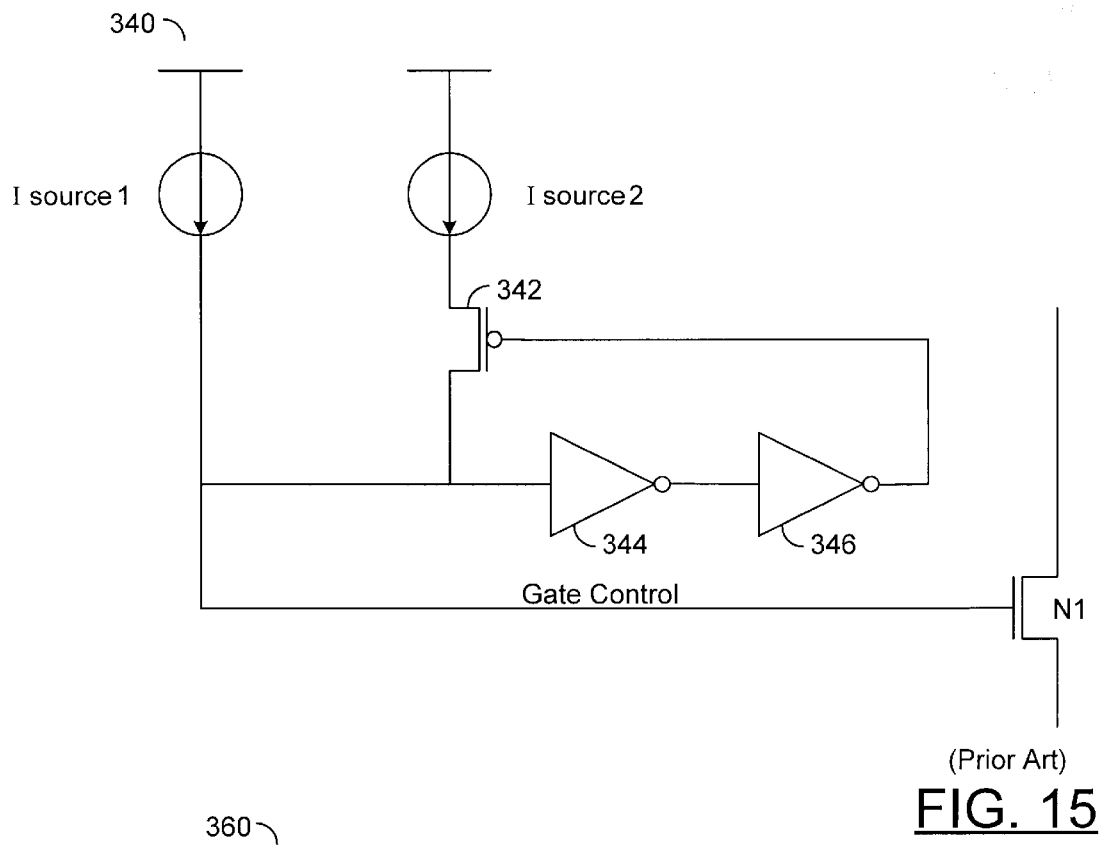
FIG. 15 illustrates a conventional circuit used to control the gate of a transistor.

Referring to FIG. 15, a diagram of a conventional gate control circuit 340 is shown. The circuit 340 generally comprises a current source Isource1, current source Isource2, a transistor 342, an inverter 344, an inverter 346 and a transistor N1. The inverters 344 and 346 generally provide a delay between the drain of the transistor 342 and the gate of the transistor 342. The inverters 344 and 346 provide a delay in turning on the current source Isource2. However, the circuit 340 generally suffers from the deficiencies in that it does not accurately set and track the threshold voltage of the transistor N1.

Figure 16:
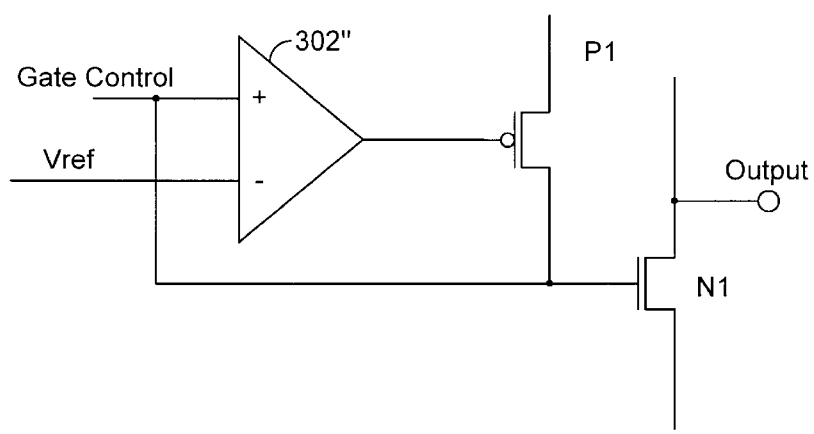
FIG. 16 illustrates one embodiment of the comparator portion of the circuits of FIG. 13 and 14.

Referring to FIG. 16, a diagram of a gate control circuit 360 is shown. The gate control circuit 360 generally comprises a comparator 302", a transistor P1 and a transistor N1. The gate control circuit 360 generally represents the components necessary to control the transistor P1, which may be used to turn on the current source Isource2 described in connection with FIG. 14.

A problem associated with designing a circuit to reduce the delay in a buffer occurs when the transistor voltage threshold changes over processing temperature conditions (i.e., process corners). Therefore, the circuit must generally be designed not only to reduce delay, but also to track the process variations. The current source Isource3 generally establishes the reference voltage Vref. The reference voltage Vref generally tracks the threshold voltage at the gate of the transistor N1 (of FIG. 13). If the current source Isource2 is left on for too long, then the waveform presented at the output of the circuit 300 may become distorted. The operation of the circuit 300 may be viewed as feedback created between the output and the positive input of the comparator 302. This feedback is generally compared to the reference voltage Vref and may reduce the stored charge at the gate of the transistor P1.

While the invention has been particularly shown and described with reference to the preferred embodiments thereof, it will be understood by those skilled in the art that various changes in form and details may be made without departing from the spirit and scope of the invention.

I claim:

1. A circuit comprising:
   a first driver circuit configured to generate (i) a first output signal and (ii) a first control signal in response to a first input signal;
   a delay circuit configured to generate a delay signal in response to (i) a second input signal and (ii) said first control signal; and
   a second driver circuit configured to generate a second output signal in response to said delay signal, wherein said delay circuit adjusts a crossover point between said first and second output signals.

2. The circuit according to claim 1 wherein:
   said first input signal comprises a first pair of complementary input signals; and
   said second input signal comprises a second pair of complementary input signals.

3. The circuit according to claim 1 wherein said delay circuit comprises:
   a comparator circuit configured to present a second control signal in response to (i) said first control signal and (ii) a threshold voltage; and
   an output circuit configured to present said delay signal in response to said second control signal, wherein said threshold voltage controls said delay circuit.

4. The circuit according to claim 3 wherein said output circuit comprises a memory cell.

5. The circuit according to claim 4 wherein said memory cell comprises a flip-flop.

6. The circuit according to claim 5 wherein said flip-flop comprises a reset/set (R/S) flip-flop.

7. The circuit according to claim 3, wherein said first and second input signals are generated in response to a data input signal.

8. The circuit according to claim 7 wherein said delay circuit further comprises an enable circuit coupled between said comparator circuit and said output circuit to enable said delay signal in response to a transition of said second input signal.

9. A Universal Serial Bus driver comprising the circuit of claim 1.

10. A circuit comprising:

means for generating (i) a first output signal and (ii) a first control signal in response to a first input signal;

means for generating a delay signal in response to (i) a second input signal and (ii) said first control signal; and means for generating a second output signal in response to said delay signal, wherein said delay circuit adjusts a crossover point between said first and second output signals.

11. The circuit according to claim 10 wherein said means for generating said delay signal further comprises:

comparator means for generating a second control signal in response to (i) said first control signal and (ii) a threshold voltage; and means for generating said delay signal in response to said second control signal.

12. The circuit according to claim 11, wherein said means for generating said delay signal comprises means for enabling coupled between said comparator means and said output circuit means to enable said delay signal in response to a transition of said second input signal.

13. A Universal Serial Bus driver comprising the circuit of claim 10.

14. A method for delaying an output signal comprising the steps of:

generating first and second input signals;

generating a first control signal and a first output signal in response to said first input signal;

generating a delay signal in response to (i) said second input signal and (ii) said first control signal; and generating a second output signal in response to said delay signal, wherein said delay signal adjusts a crossover point between said first and second output signals.

15. The method according to claim 14, wherein said generating a delay signal step further comprises:

comparing a threshold voltage with said first control signal to generate a second control signal; and generating said delay signal in further response to said second control signal.

16. The method according to clam 14, wherein said delay signal is generated in further response to said second input signal.

\* \* \* \* \*